US007430396B2

United States Patent
Sun et al.

(10) Patent No.: US 7,430,396 B2
(45) Date of Patent: Sep. 30, 2008

(54) ENCODING LOW DENSITY PARITY CHECK (LDPC) CODES THROUGH AN LDPC DECODER

(75) Inventors: Feng-Wen Sun, Germantown, MD (US); Mustafa Eroz, Germantown, MD (US); Lin-Nan Lee, Potomac, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 475 days.

(21) Appl. No.: 10/883,338

(22) Filed: Jul. 1, 2004

(65) Prior Publication Data

US 2005/0003756 A1   Jan. 6, 2005

Related U.S. Application Data

(60) Provisional application No. 60/484,988, filed on Jul. 3, 2003.

(51) Int. Cl.
*H04H 1/00* (2006.01)
*H03M 13/00* (2006.01)

(52) U.S. Cl. .......................... 455/3.01; 455/74; 455/75; 455/3.03; 714/758; 714/752

(58) Field of Classification Search ................ 455/3.01, 455/3.02, 3.03, 3.05, 414.1, 427, 428, 13.2, 455/12.1, 17, 20, 21, 23, 114.2, 63.1, 74, 455/75, 18; 714/758, 801, 800, 755, 760, 714/752, 786–796; 375/285, 298, 340–346; 370/208, 316, 509, 332

See application file for complete search history.

(56) References Cited

U.S. PATENT DOCUMENTS

| 2002/0051501 | A1 | 5/2002 | Demjanenko et al. |
| 2004/0034827 | A1 | 2/2004 | Shen et al. |
| 2005/0149844 | A1* | 7/2005 | Tran et al. .................... 714/800 |
| 2005/0278606 | A1* | 12/2005 | Richardson et al. ......... 714/760 |
| 2007/0011568 | A1* | 1/2007 | Hocevar ...................... 714/758 |
| 2007/0124644 | A1* | 5/2007 | Shen et al. .................. 714/752 |

FOREIGN PATENT DOCUMENTS

EP   1 387 496   2/2004

OTHER PUBLICATIONS

Canadian Office Communication dated Jul. 17, 2006 in Canadian counterpart application No. 2472827.
Chinese Office Communication dated Dec. 8, 2006 in Chinese counterpart application No. 2004100552732.
Japanese Office Communication dated Jul. 13, 2006 in Japanese counterpart application No. 2004-197849.
Japanese Office Communication dated Apr. 10, 2007 in Japanese counterpart application No. 2004-197849.
Richardson, Thomas, J., Urbanke, Rudiger L.; "Efficient Encoding of Low Density Parity Check Codes"; IEEE Transactions Information Theory; vol. 47, No. 2; Feb. 2001; XP11027880; pp. 638-656.
EPO Communication dated Apr. 03, 2008 in European counterpart Application No. 04254014.6 corresponding to U.S. Appl. No. 10/883,338 filed Jul. 01, 2004 by Feng-Wen Sun et al.

* cited by examiner

*Primary Examiner*—John J. Lee (57) ABSTRACT

An approach is providing for supporting broadcast transmission of low density parity check (LDPC) coded signals. A receiver includes a decoder configured to decode an LDPC signal to output a decoded signal. The decoder is further configured to operate as an encoder; as such, interference cancellation can be implemented by the encoder re-encoded the received decoded signal. The above approach has particular applicability to satellite broadcast systems.

11 Claims, 5 Drawing Sheets

$$H = \begin{bmatrix} n_1 & n_2 & n_3 & n_4 & n_5 & n_6 & n_7 & n_8 \\ 1 & 0 & 0 & 1 & 1 & 0 & 0 & 1 \\ 0 & 1 & 1 & 0 & 0 & 1 & 0 & 0 \\ 1 & 0 & 1 & 0 & 0 & 1 & 1 & 1 \\ 0 & 1 & 0 & 1 & 0 & 1 & 1 & 0 \end{bmatrix} \begin{matrix} m_1 \\ m_2 \\ m_3 \\ m_4 \end{matrix}$$

ENCODING LOW DENSITY PARITY CHECK (LDPC) CODES THROUGH AN LDPC DECODER

RELATED APPLICATIONS

This application is related to, and claims the benefit of the earlier filing date under 35 U.S.C. §119(e) of, U.S. Provisional patent application Ser. No. 60/484,988, filed Jul. 3, 2003, titled "Efficient Encoding of a Family of LDPC Code Through Its Decoder"; the entirety of which is incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

For example, in broadcast applications, because of the staggering quantity of receivers utilized, any cost impact stemming from the receiver hardware, which includes the LDPC decoders, is magnified significantly.

On the other hand, in some applications, such as satellite broadcast applications, the number of transmitters needed is relatively small. This leads to much higher costs for the transmitter than the receiver.

Therefore, there is a need to configure a standard receiver to perform the encoding operation. In this way, the transmitter can enjoy the economics of the receiver.

SUMMARY OF THE INVENTION

These and other needs are addressed by the present invention, wherein an approach is provided for performing low density parity check (LDPC) encoding using decoder components. In one embodiment, n-k bits are initialized according to a maximum value of likelihood ratio of a channel bit associated with a logical zero value. The above approach advantageously provides an encoding capability through the sharing of existing decoder hardware, thereby enhancing the functionality of the receiver with minimal cost. Since the LDPC decoder can employ a multiplicity of parallel processing engines, the decoder can utilize these resources to provide fast and efficient encoding. Also, the above arrangement advantageously eliminates the need to build dedicated hardware for the encoder within the receiver. This provides significant cost savings in satellite broadcast applications, which can involve deployment of millions of receivers.

According to one aspect of an embodiment of the present invention, a method for supporting broadcast transmission of low density parity check (LDPC) coded signals to a plurality of receivers is disclosed. The method includes receiving an input signal by one of the receivers, the one receiver including an LDPC decoder. Also, the method includes encoding, by the decoder, the input signal to output an encoded signal.

According to another aspect of an embodiment of the present invention, an apparatus for receiving broadcast transmission of low density parity check (LDPC) coded signals is disclosed. The apparatus includes means for receiving an input signal by one of the receivers, the one receiver including an LDPC decoder. The apparatus also includes a decoder configured to encode the input signal to output an encoded signal.

According to yet another aspect of an embodiment of the present invention, a decoder for generating low density parity check (LDPC) codes is disclosed. The decoder includes a processor configured to decode a received LDPC encoded signal. The processor is further configured to encode the decoded signal for interference cancellation with respect to the received LDPC encoded signal.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF THE PREFERRED EMBODIMENT

A system, method, and software for efficiently encoding Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
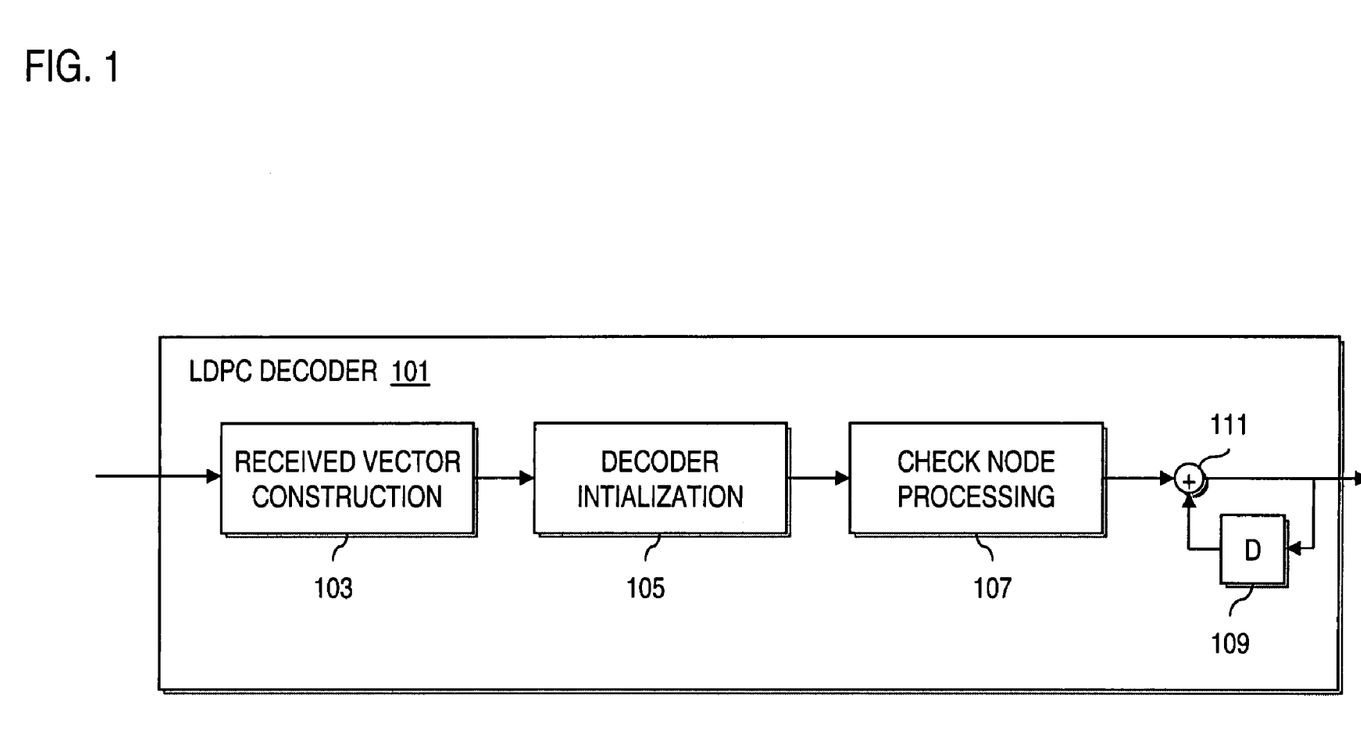
FIG. 1 is a diagram of a LDPC decoder capable of performing LDPC encoding, according to an embodiment of the present invention.

FIG. 1 is a diagram of a Low Density Parity Code (LDPC) decoder capable of performing LDPC encoding, according to an embodiment of the present invention. In general, an LDPG encoding process involves accepting input from an information source and outputting a coded stream of higher redundancy suitable for error correction processing at the receiver. By way of example, the information source generates k signals from a discrete alphabet, k. LDPC codes are specified with parity check matrices. On the other hand, encoding LDPC codes requires, in general, specifying the generator matrices. Even though it is possible to obtain generator matrices from parity check matrices using Gaussian elimination, the resulting matrix is no longer sparse and storing a large generator matrix can be complex.

The LDPC encoding process generates signals from alphabet Y to a modulator using a simple encoding technique that makes use of only the parity check matrix by imposing structure onto the parity check matrix. Specifically, a restriction is placed on the parity check matrix by constraining a certain portion of the matrix to be triangular. The construction of such a parity check matrix is described more fully below in FIG. 4. Such a restriction results in negligible performance loss, and therefore, constitutes an attractive trade-off.

As shown, the functional components supporting the LDPC enzoding process by the decoder 101 include a received vector construction module 103, a decocer initialization module 105, and a check node processing module 107. The check node processing module 107 outputs to an adder 111 that sums the previous outputs stored in the register 109. These modules 103, 105, 107 operate in conjunction to encode new information or re-encode the received data stream (as in the interference cancellation application), This process is more fully described with respect to FIGS. 5 and 6.

To appreciate the advantages offered by the present invention, it is instructive to more closely examine how LDPC codes are generated, as discussed below.

Figure 2:
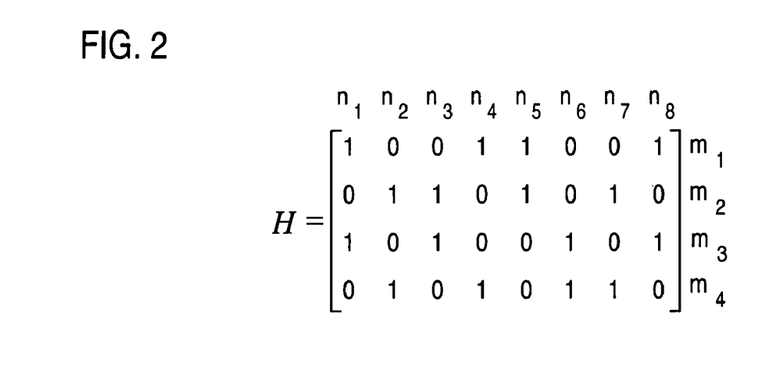
FIG. 2 is a diagram of a sparse parity check matrix, in accordance with an embodiment of the present invention.

FIG. 2 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate ½ is shown in FIG. 2. The same code can be equivalently represented by the bipartite graph, per FIG. 3.

Figure 3:
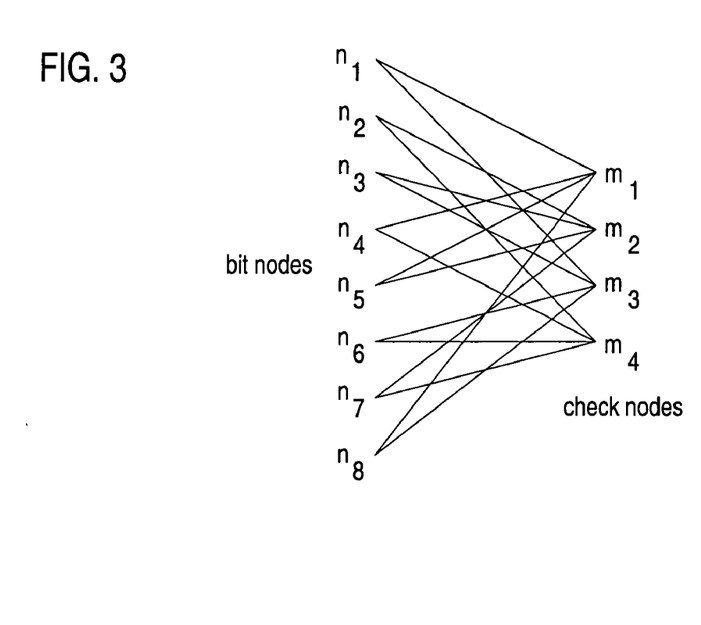
FIG. 3 is a diagram of a bipartite graph of an LDPC code of the matrix of FIG. 2.

FIG. 3 is a diagram of a bipartite graph of an LDPC code of the matrix of FIG. 2. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the example of FIG. 1, the LDPC decoder 101 is considered a message passing decoder, whereby the decoder 101 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$, that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

Figure 4:
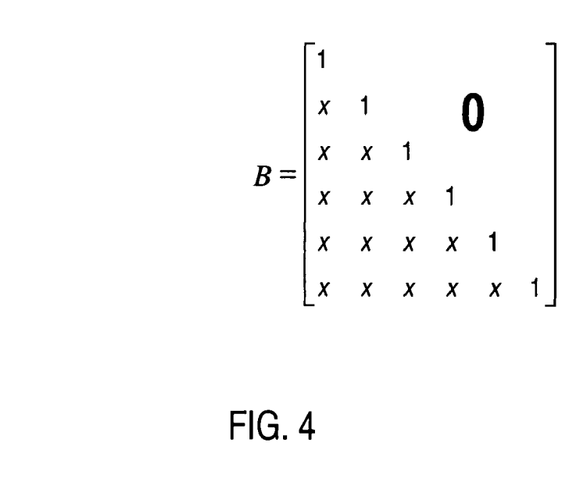
FIG. 4 is a diagram of a sub-matrix of a sparse parity check matrix, wherein the sub-matrix contains parity check values restricted to the lower triangular region, according to an embodiment of the present invention.

FIG. 4 is a diagram of a sub-matrix of a sparse parity check matrix, wherein the sub-matrix contains parity check values restricted to the lower triangular region, according to an embodiment of the present invention. As described previously, the LDPC encoding process can employ a simple encoding technique by restricting the values of the lower triangular area of the parity check matrix. According to an embodiment of the present invention, the restriction imposed on the parity check matrix is of the form:

$$H_{(n-k)\times n} = [A_{(n-k)\times k} B_{(n-k)\times(n-k)}]$$

where B is lower triangular.

Any information block $i=(i_0, i_1, \ldots, i_{k-1})$ is encoded to a codeword $c=(i_0, i_1, \ldots, i_{k-1}, p_0, p_1, \ldots p_{n-k-1})$ using $Hc^T=0$, and recursively solving for parity bits; for example, $$a_{00}i_0+a_{01}i_1+\ldots+a_{0,k-1}i_{k-1}+p_0=0 \Rightarrow \text{Solve } p_0$$

$$a_{10}i_0+a_{11}i_1+\ldots+a_{1,k-1}i_{k-1}+b_{10}p_0+p_1=0 \Rightarrow \text{Solve } p_1$$

and similarly for $p_2, p_3, \ldots, p_{n-k-1}$.

Because the LDPC decoder 101 can be implemented as a highly parallel system, a properly designed encoder using the hardware for decoding can be extremely efficient in terms of processing time. Thus, the encoding process can "steal" clock cycles without affecting the normal operation of decoding. In terms of hardware cost, encoding by leveraging the decoder hardware advantageously adds little or no additional cost to the decoder 101.

For the purposes of explanation, attention is drawn to one particular family of LDPC codes (as described in FIG. 4), although the approach of the present invention can be applied to other LDPC codes. Continuing with that set of codes, in terms of matrix operation, the computation of the parity bits can be expressed as follows:

$$\bar{p}=B^{-1}A\bar{\imath}.$$

Encoding can be accomplished by performing the above matrix multiplications. This encoding process can be adapted to the LDPC decoder 101. For the purposes of explanation, it is assumed that the LDPC is decoded by a belief propagation.

Two cases are considered: the first case involves using hardware of the decoder 101 to encode, in general, any information (FIGS. 5 and 6); and the second case concerns re-encoding data that is being decoded by the same hardware. In principle, the second case can be a special case of the first case, and consequently be handled precisely the same as the first case. In the alternative, certain advantages attend the treatment of the second case differently than merely viewing this case as a specific case of the former approach.

Figure 5:
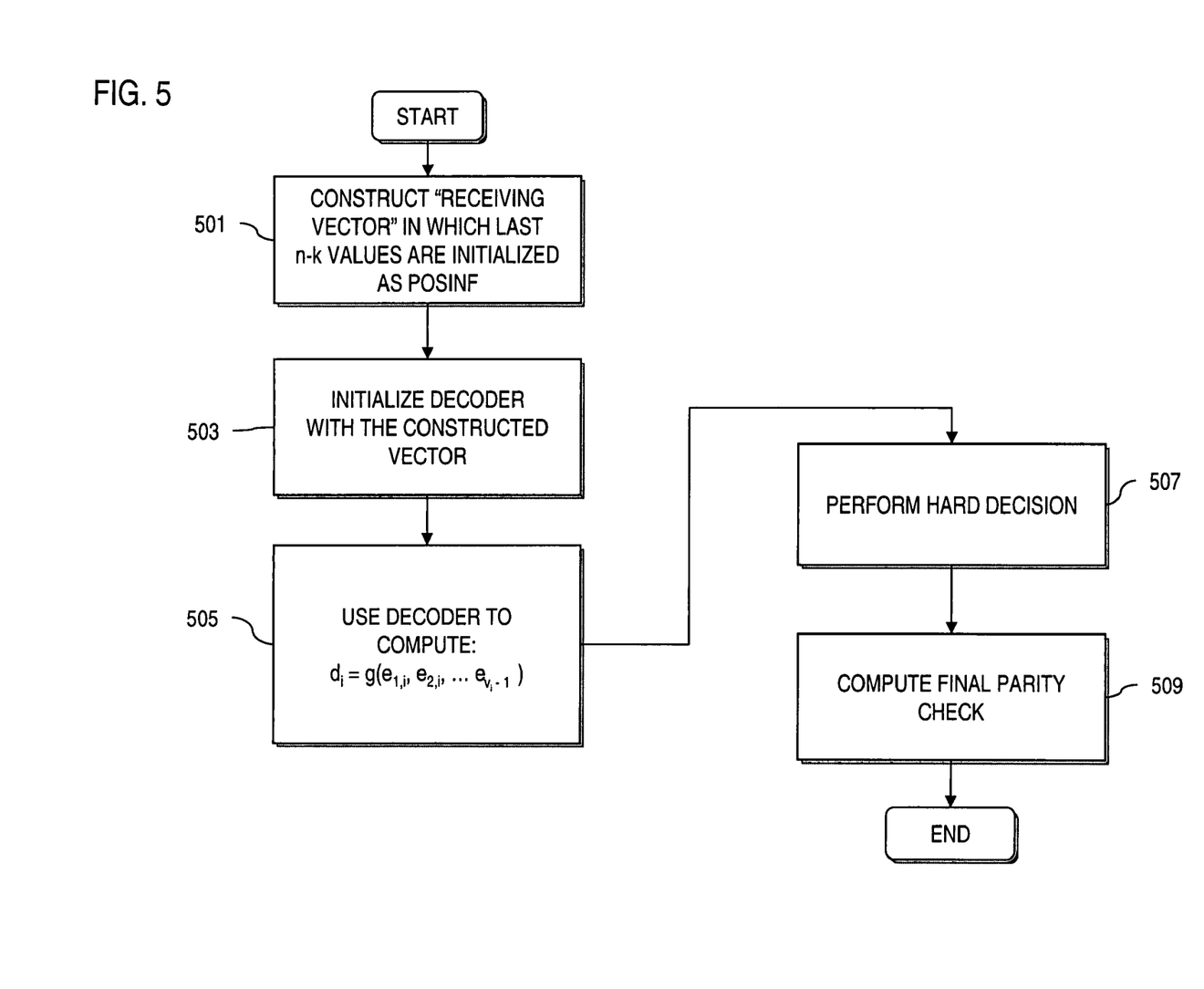
FIG. 5 is a flow chart of the operation of the LDPC decoder in FIG. 1 used to encode data, according to an embodiment of the present invention.

FIG. 5 is a flow chart of the operation of the LDPC decoder in FIG. 1 used to encode data, according to an embodiment of the present invention. It is recognized that any hardware implementation has to use finite precision. Accordingly, the following is defined: let POSINF and NEGINF be respectively the maximum value of likelihood ratio for a particular channel bit to take 1 or −1 (logical 0 or 1 respectively). The encoding algorithm for the first case is as follows.

In step 501, the decoder 101, per the module 103, constructs a "receiving vector" from the k information bit to be encoded such that the first k received values are mapped from the k information bit with logical zero mapped to POSINF and logical one mapped into NEGINF. The last n-k received values are either initialized as POSINF. Next, the decoder 101, as in step 503, is initialized by the module 105 with the constructed vector (all the edge values) by performing the normal initialization of the decoder 101.

In step 505, for the i-th check node, the check node processing engine 107 computes the following:

$$d_i = g(e_{1,i}, e_{2,i}, \ldots e_{v_i-1}),$$

where $v_i$ is the number of edges connected to the i-th check node. Without loss of generality, it is assumed that $e_{v_i}$ is an edge connected to a bit node corresponding to a non-information bit (a parity check bit).

Next, the decoder 101 performs, as in step 507, hard decision $\bar{d}=(d_0, d_{n-k-1})$ into a binary vector $\bar{b}=(b_0, \ldots, b_{n-k-1})$. The final parity check $\bar{p}$ is then computed as follows (step 509):

$$p_i = \sum_{m=0}^{i} \oplus b_m.$$

From the above process, it is observed that with the computational time of one iteration of the decoder 101, the encoding process can also be carried out by the decoder 101. Given the fact that the LDPC decoder 101 generally needs to iterate at least tens of iterations for decoding of most codes, the time for performing the encoding is a relatively small fraction of the time to decode a typical LDPC frame.

Figure 6:
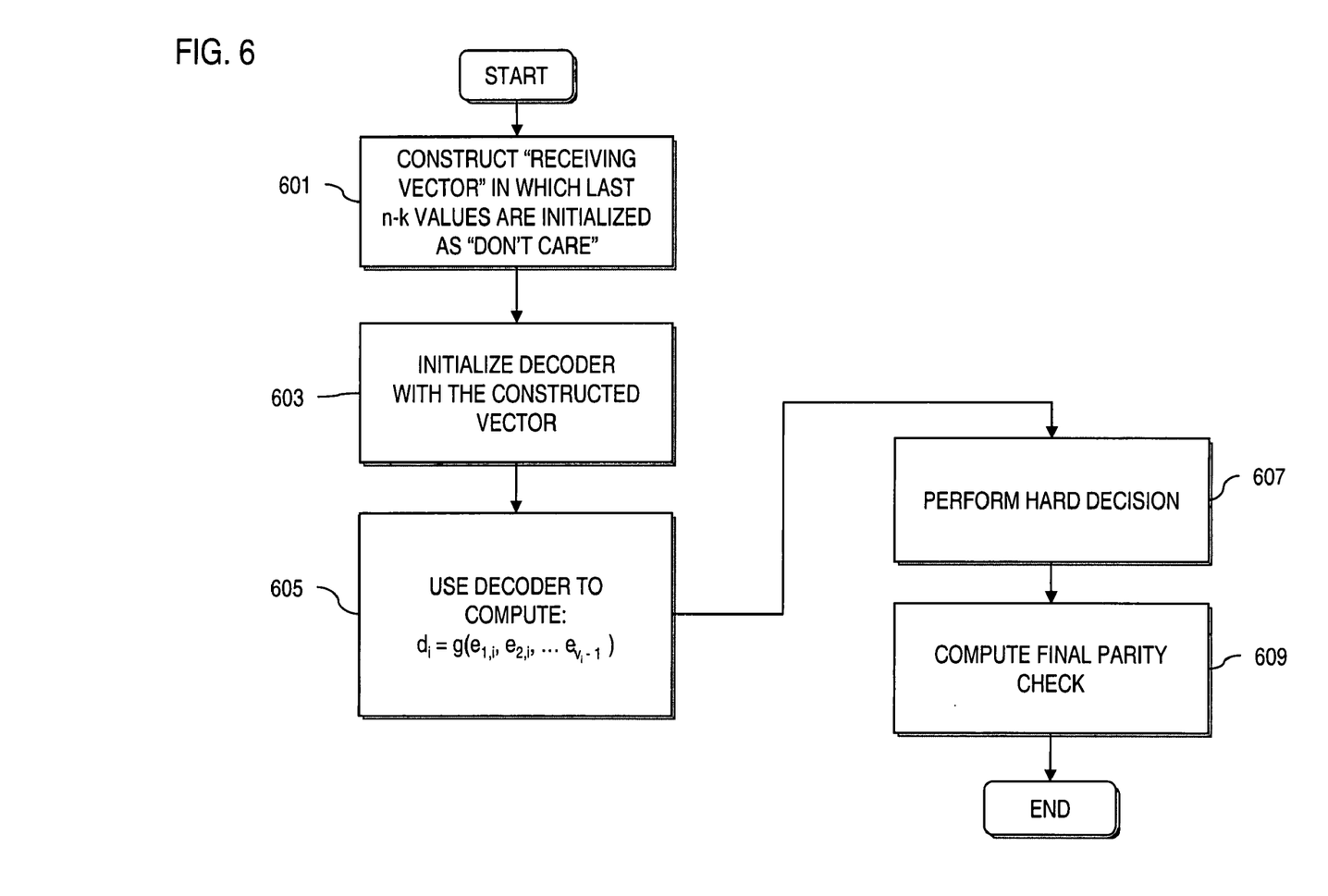
FIG. 6 is a flow chart of a modified operation of the LDPC decoder in FIG. 1 used to encode data, according to an embodiment of the present invention.

FIG. 6 is a flow chart of a modified operation of the LDPC decoder in FIG. 1 used to encode data, according to an embodiment of the present invention. This modified process is similar to that of FIG. 5; however, in step 601, the last n-k received values are either initialized as "DON'T CARE" (or null value) instead of POSINF. The steps of 603-609 correspond to steps 503-509, and thus, are not described.

Figure 7:
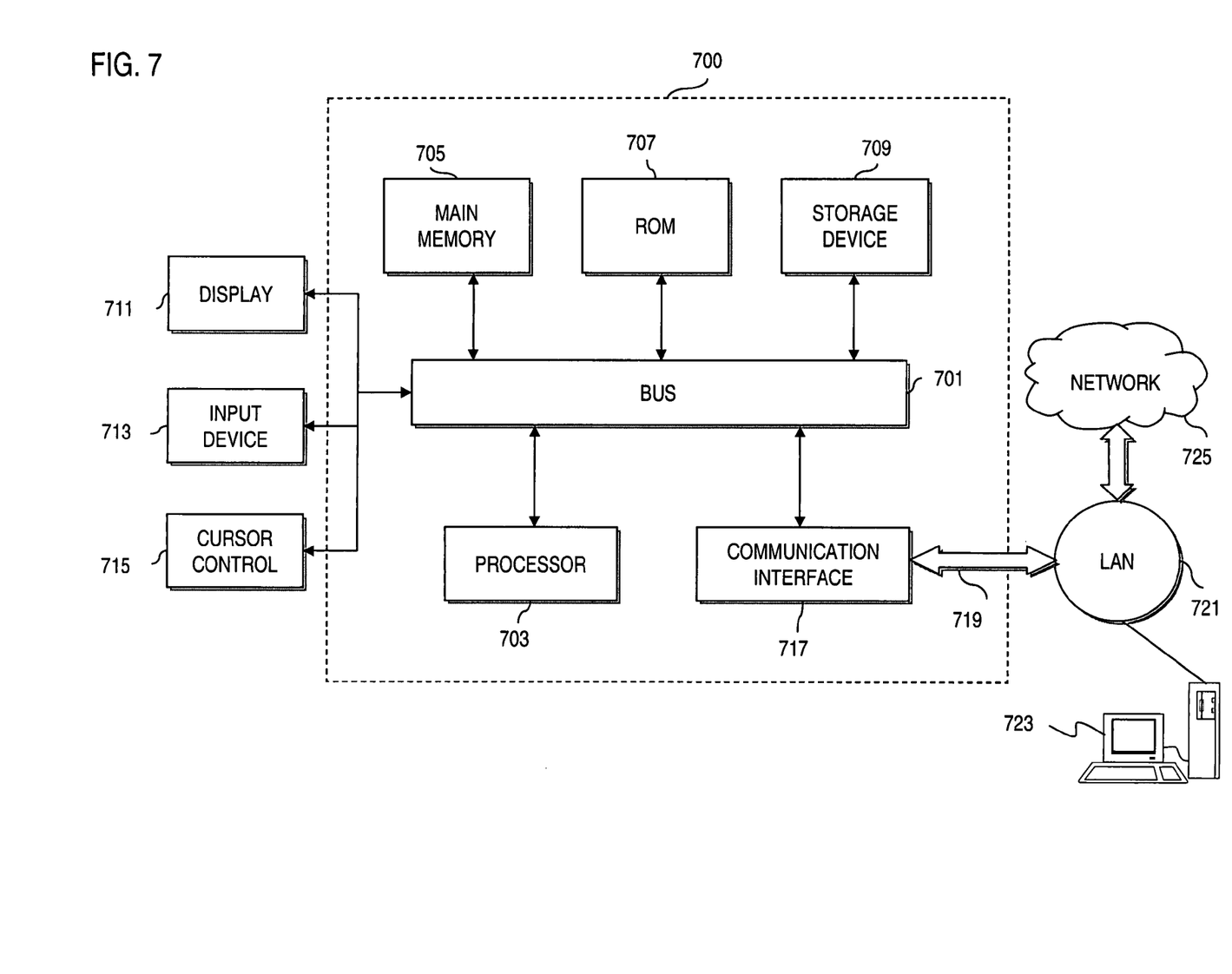
FIG. 7 is a diagram of a computer system that can perform the processes of encoding and decoding of LDPC codes, in accordance with embodiments of the present invention.

FIG. 7 illustrates a computer system upon which an embodiment according to the present invention can be implemented. The computer system 700 includes a bus 701 or other communication mechanism for communicating information, and a processor 703 coupled to the bus 701 for processing information. The computer system 700 also includes main memory 705, such as a random access memory (RAM) or other dynamic storage device, coupled to the bus 701 for storing information and instructions to be executed by the processor 703. Main memory 705 can also be used for storing temporary variables or other intermediate information during execution of instructions to be executed by the processor 703. The computer system 700 further includes a read only memory (ROM) 707 or other static storage device coupled to the bus 701 for storing static information and instructions for the processor 703. A storage device 709, such as a magnetic disk or optical disk, is additionally coupled to the bus 701 for storing information and instructions.

The computer system 700 may be coupled via the bus 701 to a display 711, such as a cathode ray tube (CRT), liquid crystal display, active matrix display, or plasma display, for displaying information to a computer user. An input device 713, such as a keyboard including alphanumeric and other keys, is coupled to the bus 701 for communicating information and command selections to the processor 703. Another type of user input device is cursor control 715, such as a mouse, a trackball, or cursor direction keys for communicating direction information and command selections to the processor 703 and for controlling cursor movement on the display 711.

According to one embodiment of the invention, generation of LDPC codes is provided by the computer system 700 in response to the processor 703 executing an arrangement of instructions contained in main memory 705. Such instructions can be read into main memory 705 from another computer-readable medium, such as the storage device 709. Execution of the arrangement of instructions contained in main memory 705 causes the processor 703 to perform the process steps described herein. One or more processors in a multi-processing arrangement may also be employed to execute the instructions contained in main memory 705. In alternative embodiments, hard-wired circuitry may be used in place of or in combination with software instructions to implement the embodiment of the present invention. Thus, embodiments of the present invention are not limited to any specific combination of hardware circuitry and software.

The computer system 700 also includes a communication interface 717 coupled to bus 701. The communication interface 717 provides a two-way data communication coupling to a network link 719 connected to a local network 721. For example, the communication interface 717 may be a digital subscriber line (DSL) card or modem, an integrated services digital network (ISDN) card, a cable modem, or a telephone modem to provide a data communication connection to a corresponding type of telephone line. As another example, communication interface 717 may be a local area network (LAN) card (e.g. for Ethernet™ or an Asynchronous Transfer Model (ATM) network) to provide a data communication connection to a compatible LAN. Wireless links can also be implemented. In any such implementation, communication interface 717 sends and receives electrical, electromagnetic, or optical signals that carry digital data streams representing various types of information. Further, the communication interface 717 can include peripheral interface devices, such as a Universal Serial Bus (USB) interface, a PCMCIA (Personal Computer Memory Card International Association) interface, etc.

The network link 719 typically provides data communication through one or more networks to other data devices. For example, the network link 719 may provide a connection through local network 721 to a host computer 723, which has connectivity to a network 725 (e.g. a wide area network (WAN) or the global packet data communication network now commonly referred to as the "Internet") or to data equipment operated by service provider. The local network 721 and network 725 both use electrical, electromagnetic, or optical signals to convey information and instructions. The signals through the various networks and the signals on network link 719 and through communication interface 717, which communicate digital data with computer system 700, are exemplary forms of carrier waves bearing the information and instructions.

The computer system 700 can send messages and receive data, including program code, through the network(s), network link 719, and communication interface 717. In the Internet example, a server (not shown) might transmit requested code belonging to an application program for implementing an embodiment of the present invention through the network 725, local network 721 and communication interface 717. The processor 703 may execute the transmitted code while being received and/or store the code in storage device 709, or other non-volatile storage for later execution. In this manner, computer system 700 may obtain application code in the form of a carrier wave.

The term "computer-readable medium" as used herein refers to any medium that participates in providing instructions to the processor 703 for execution. Such a medium may take many forms, including but not limited to non-volatile media, volatile media, and transmission media. Non-volatile media include, for example, optical or magnetic disks, such as storage device 709. Volatile media include dynamic memory, such as main memory 705. Transmission media include coaxial cables, copper wire and fiber optics, including the wires that comprise bus 701. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an approach for supporting broadcast transmission of low density parity check (LDPC) coded signals to a plurality of receivers. A receiver includes an LDPC decoder that decodes the LDPC signal to output a decoded signal as well as encodes an input signal. The input signal can be the decoded signal, whereby the re-encoded signal is used for interference cancellation. The above approach advantageously avoids deployment of a separate, dedicated encoder in the receiver.

While the present invention has been described in connection with a number of embodiments and implementations, the present invention is not so limited but covers various obvious modifications and equivalent arrangements, which fall within the purview of the appended claims.

What is claimed is:

1. A method for supporting broadcast transmission of low density parity check (LDPC) coded signals to a plurality of receivers, the method comprising:
    receiving an input signal by one of the receivers, the one receiver including an LDPC decoder;
    encoding, by the decoder, the input signal to output an encoded signal;
    receiving an LDPC coded signal;
    decoding the LDPC signal by the LDPC decoder to output a decoded signal;
    constructing a receiving vector based on a first k information bits of the decoded signal,
        where k is an integer; and
    initializing the decoder with the receiving vector, wherein the receiving vector has a length of n, where n is an integer, and the n-k bits are initialized according to a maximum value of likelihood ratio of a channel bit associated with either a logical zero value or a null value.

2. A method according to claim 1, wherein the input signal is the decoded signal, and the encoded signal is used for interference cancellation with the received LDPC signal.

3. A method according to claim 1, wherein the steps of decoding and encoding are concurrently performed.

4. A method according to claim 1, wherein the LDPC signal is received over a satellite link.

5. A method according to claim 1, wherein the LDPC coded signal is modulated according to a signal constellation that includes one of 8-PSK (Phase Shift Keying), 16-QAM (Quadrature Amplitude Modulation), 16-APSK (Amplitude Phase Shift Keying), 32-APSK and QPSK (Quadrature Phase Shift Keying).

6. An apparatus for receiving broadcast transmission of low density parity check (LDPC) coded signals, the apparatus comprising:
    means for receiving an input signal by one of the receivers, the one receiver including an LDPC decoder;
    means for receiving an LDPC coded signal, wherein the decoder decodes the LDPC signal to output a decoded signal; and
    a decoder configured to encode the input signal to output an encoded signal, wherein the decoder is further configured to construct a receiving vector based on a first k information bits of the decoded signal, where k is an integer, and to initialize the decoder with the receiving vector,
    wherein the receiving vector has a length of n, where n is an integer, and the n-k bits are initialized according to a maximum value of likelihood ratio of a channel bit associated with a logical zero value or associated with a null value.

7. An apparatus according to claim 6, wherein the input signal is the decoded signal, and the encoded signal is used for interference cancellation with the received LDPC signal.

8. An apparatus according to claim 6, wherein the decoder concurrently performs the decoding and the encoding.

9. An apparatus according to claim 6, wherein the LDPC signal is received over a satellite link.

10. An apparatus according to claim 6, wherein the LDPC coded signal is modulated according to a signal constellation that includes one of 8-PSK (Phase Shift Keying), 16-QAM (Quadrature Amplitude Modulation), 16-APSK (Amplitude Phase Shift Keying), 32-APSK and QPSK (Quadrature Phase Shift Keying).

11. A decoder for generating low density parity check (LDPC) codes, the decoder comprising:
   a processor configured to decode a received LDPC encoded signal to output a decoded signal; and
   wherein the processor is further configured to encode the decoded signal for interference cancellation with respect to the received LDPC encoded signal and, wherein the processor is further configured to construct a receiving vector based on a first k information bits of the decoded signal, where k is an integer, and to initialize using the receiving vector,
   wherein the receiving vector has a length of n, where n is an integer, and the n-k bits are initialized according to a maximum value of likelihood ratio of a channel bit associated with a logical zero value or associated with a null value.

* * * * *